United States Patent
Zhu et al.

(10) Patent No.: US 7,134,097 B2
(45) Date of Patent: Nov. 7, 2006

(54) METHOD AND APPARATUS FOR A CONFIGURABLE METAL REGISTER

(75) Inventors: Zhubiao Zhu, Fort Collins, CO (US); Hong Jiang, Plano, TX (US); John R. Spencer, Fort Collins, CO (US); Michael A Buckley, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 412 days.

(21) Appl. No.: 10/383,120

(22) Filed: Mar. 6, 2003

(65) Prior Publication Data

US 2004/0177333 A1 Sep. 9, 2004

(51) Int. Cl.
*G06F 17/50* (2006.01)

(52) U.S. Cl. ................................ 716/1; 716/4; 716/11
(58) Field of Classification Search ................ 716/1, 716/4–5, 11–14, 16–17
See application file for complete search history.

(56) References Cited

U.S. PATENT DOCUMENTS 6,128,770 A * 10/2000 Agrawal et al. ............... 716/17
6,467,073 B1 * 10/2002 Merchant ...................... 716/16
6,629,309 B1 * 9/2003 Allen, III ....................... 716/16

* cited by examiner

*Primary Examiner*—Paul Dinh

(57) ABSTRACT

A configurable metal register of an integrated circuit that allows a register output value to be changed by changing any metal or any contact within a metal pattern solution of the register. More than one metal and/or corresponding contact within the metal pattern solution may be changed so that the register output value is correspondingly changed.

17 Claims, 4 Drawing Sheets

METHOD AND APPARATUS FOR A CONFIGURABLE METAL REGISTER

TECHNICAL FIELD

This invention relates generally to the field of integrated circuit devices, and more specifically to registers of integrated circuits.

BACKGROUND OF THE INVENTION

The design of complex integrated circuits (ICs), such as Central Processor Unit (CPU) chips, normally goes through several revisions, or turns, in silicon before the final production version is ready. These revisions could be a full turn, which includes metals and FET's, or a metal only turn in which only metal layers of the chip are changed. Fabrication of these turns is costly. As an example, for a current CPU, a full turn may cost on the order of one million dollars while a metal only turn may cost on the order of half a million dollars. A turn with a smaller number of metal layers changed (a partial metal turn) costs less. The cost is roughly proportional to the number of metal layers with its associated contacts, with lower level metal costing more. Reducing the number of metal layers that need to be changed helps to reduce the cost of fabrication. As an example, a design chip's first turn may only change one metal layer with the metal layer's associated contact.

The front side bus is the portion of an integrated circuit (IC) that is responsible for transporting data among the various subsystems and devices that make up the IC. In many integrated circuit applications, the performance of the front side bus of the integrated circuit is controlled by a collection of registers. As bus speed increases and the number of chips on the bus increase, the signal integrity of bus signals becomes more important. That is why many registers may be added to the CPU to change the associated bus parameters, such as driver termination, driver slew rate, receiver trip point, receiving deglitch delay, etc.

When the IC is in the design stages, it may undergo iterations of changes to the register values, where each iteration can require the fabrication of a new prototype IC. For each revision of the IC, the input/output performance of the front side bus of the IC is tested. If the bus performance does not meet design guidelines, then the IC layout is altered and a new IC revision fabricated. Clearly, the turnaround time of this process can be lengthy and affect the overall design time of the IC. Conversely, it can be seen that for an IC already in a production environment, having registers set to incorrect values can be catastrophic to the IC operation. This situation may occur if the design and prototyping was not done properly or it may be due to unforeseen system level impacts.

Referring now to FIG. 1, a block diagram of a fabrication process 100 for a circuit containing one or more registers is shown. After an IC containing one or more registers is designed (block 110), the IC is fabricated for testing (block 120). The IC is then tested for layout errors (block 130). If the IC test fails (block 140), then the register values must be changed during IC layout and the IC fabricated and tested again (blocks 120 and 130). The number of times the registers are changed, the layout changed and the IC fabricated and re-tested has a large impact on the overall cost and time-to-market of the IC. A second concern can occur if the IC passes the pre-production test and enters the production process (block 150). If an error is detected after the IC is in production (block 155), either due to a design flaw or an error in the previous test process of block 130, then the IC's that have been produced may not be usable, the IC layout will need to be modified (block 145) and the IC fabricated and tested again (blocks 120 and 130). Clearly detection of an error after production has started is undesirable, since many IC's may be wasted.

SUMMARY

Therefore, in accordance with certain embodiments of the present invention, in an integrated circuit structure of the present invention, a metal pattern solution provides that a change in the metals or the contacts of the metal pattern solution causes an output value of a register to change. Modifying the metal pattern solution, which is coupled to the register, by changing any of the metals or the contacts operates to modify the output value of the register. In accordance with certain other embodiments of the present invention, the metal pattern solution is coupled to a metal switching tower, which is then coupled to ground and coupled to a multiplexer (mux). The mux is coupled to a plurality of inputs and uses a selection input from the metal switching tower to select an appropriate output value of the register. The output value of the register is coupled to a control signal that controls the validity of the output value, thereby saving power. A focused ion beam (FIB) may be used to sever the connection between the metal switching tower and ground, causing the selection input to change value. Hence the output value of the register may be affected by the action of the FIB. According to a method consistent with certain embodiments of the present invention, an output value of a register of a plurality of registers of an integrated circuit structure may be configured by changing one or more of a plurality of metals and a corresponding plurality of contacts in a metal pattern solution of the integrated circuit structure.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
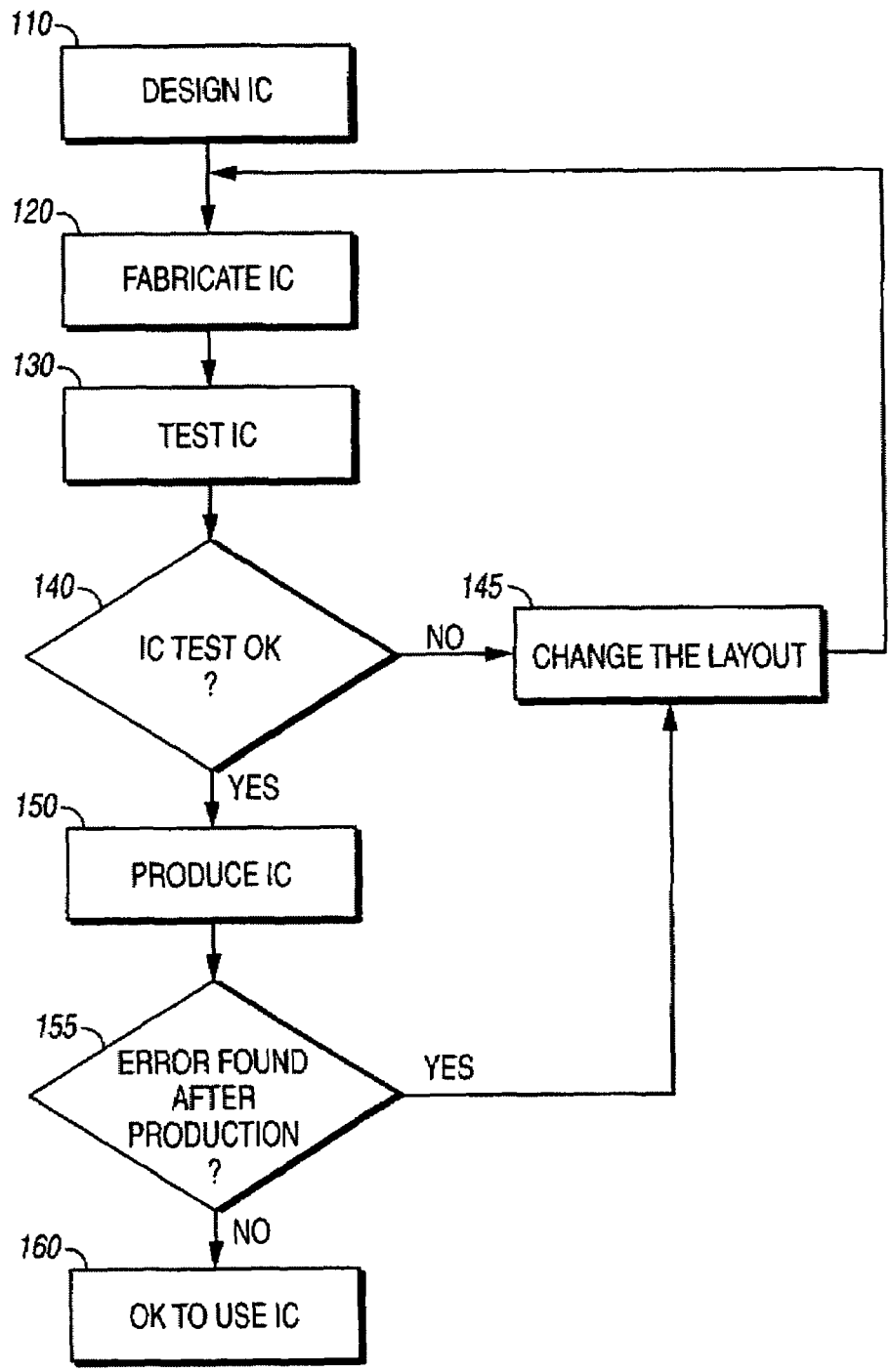
FIG. 1 is a block diagram of a fabrication process for a circuit containing one or more registers, according to the prior art.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Figure 2:
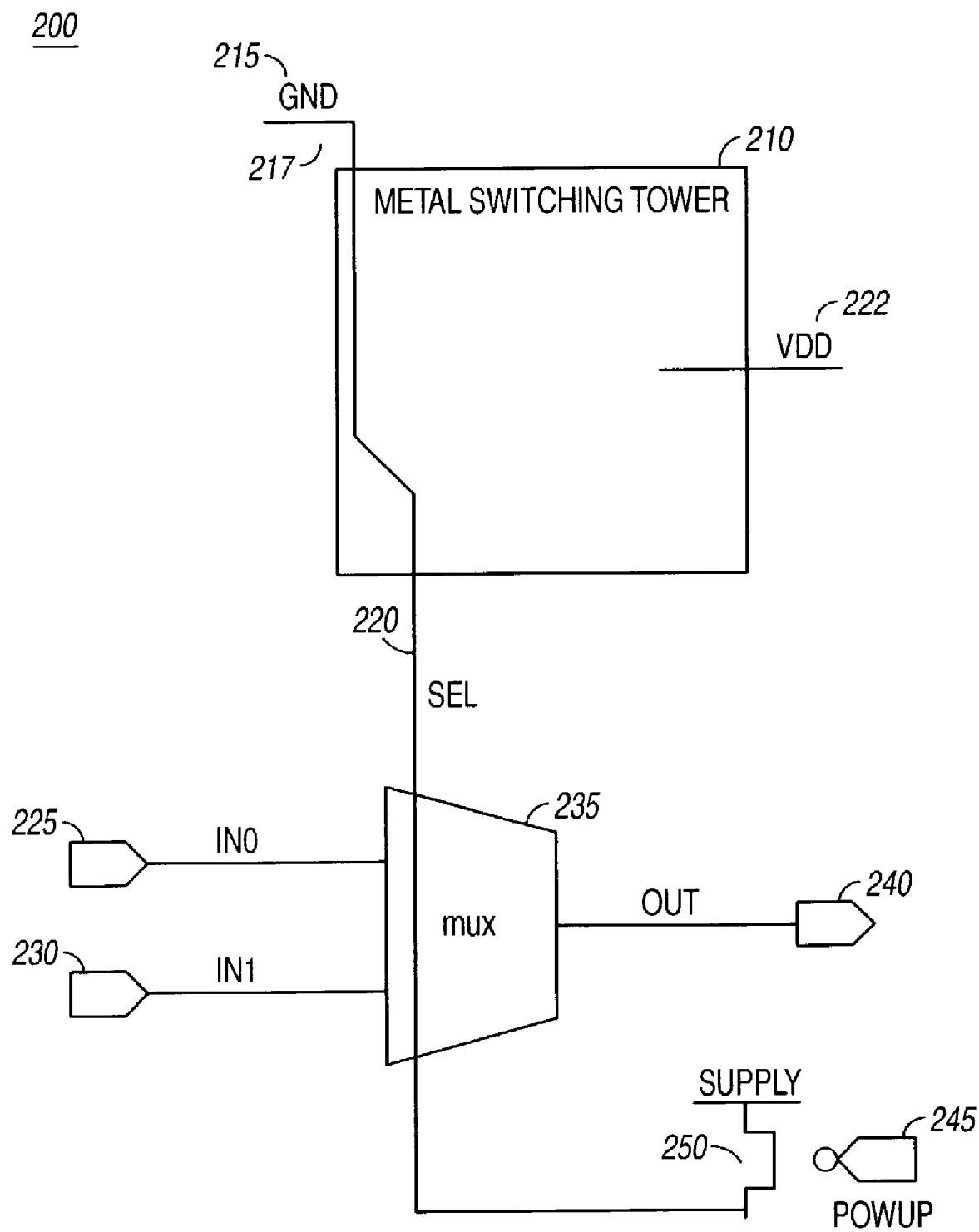
FIG. 2 is a circuit diagram of a configurable metal register, according to a certain embodiment of the present invention.

Referring now to FIG. 2, a circuit diagram 200 of a configurable metal register structure is shown, according to a certain embodiment of the present invention. Input IN0 225 is the default output of mux 235 because of a coupling of mux selection 220 to ground 215 through the use of Metal Switching Tower 210. In a certain embodiment of the present invention, Metal Switching Tower 210 is coupled to Vdd 240. After a focused ion beam (FIB) 217 cuts the connection of mux selection 220 to ground 215, mux selection 220 becomes high (or one) by the weak pull-up device 250 when the POWUP control signal 245 is zero. In a certain embodiment of the present invention, FIB 217 is not present, and the connection of mux selection 220 to ground 215 is controlled externally. After the mux selection 220 becomes 1, input IN1 230 is chosen by mux 235 as the output 240. In a certain embodiment of the present invention, a complimentary value of input IN1 230 is chosen as the output 240 of mux 235. The output 240 of mux 235 is latched by the rising edge of POWUP control signal 245. It is noted that the output 240 of mux 235 may be latched by the falling edge of POWUP control signal 245 without departing from the spirit and scope of the present invention. In a certain embodiment of the present invention, the POWUP control signal 245 is operable to save power during normal operation of a chip having a metal pattern solution.

Figure 3:
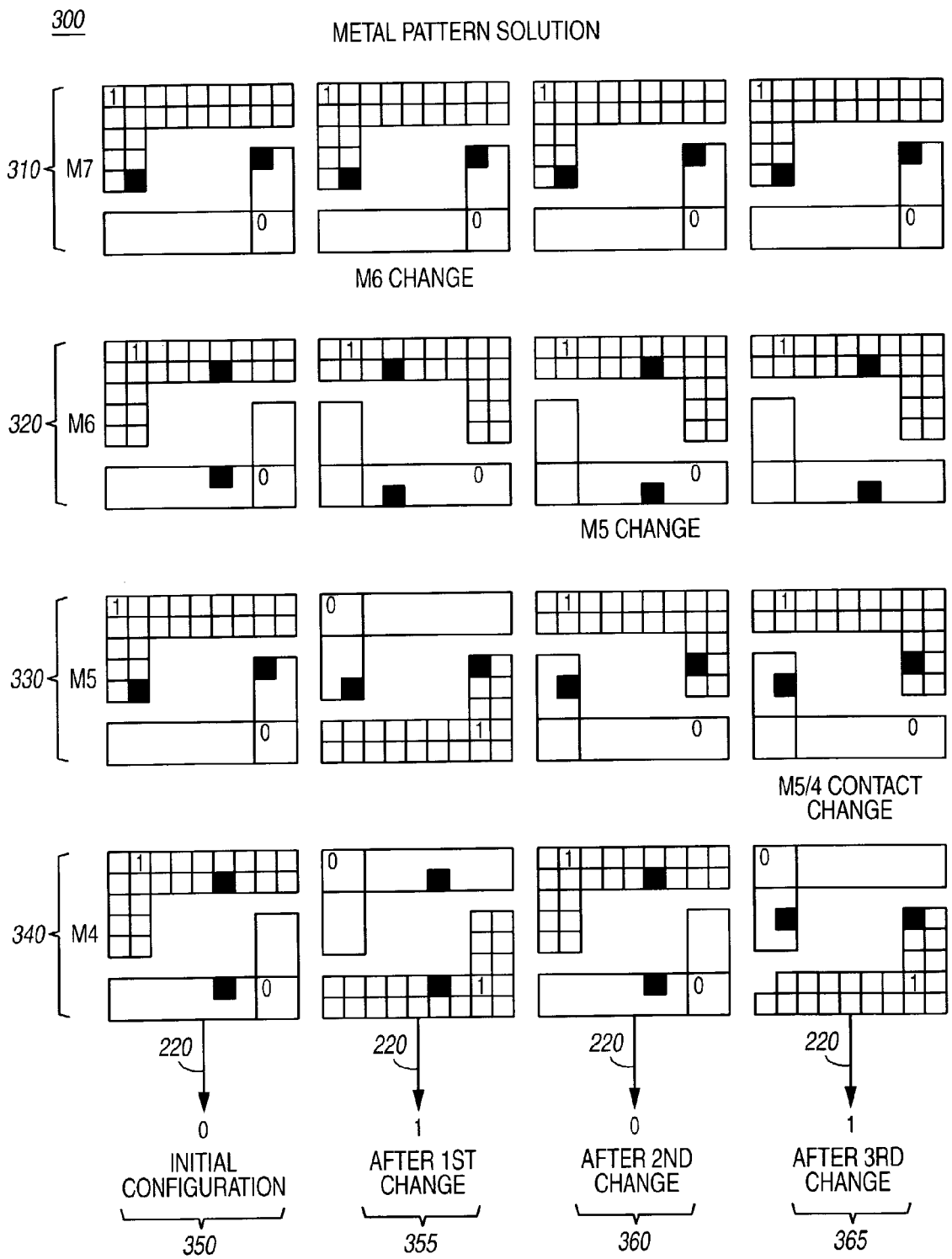
FIG. 3 is a metal pattern solution example of the metal pattern of a flexible metal register, according to a certain embodiment of the present invention.

Referring now to FIG. 3, a metal pattern solution example 300 of a configurable metal register structure as may reside within Metal Switching Tower 210 is shown, according to a certain embodiment of the present invention. A metal pattern solution in this example is represented by a plurality of metal/contact layers: metal/contact M4 340, metal/contact M5 330, metal/contact M6 320, metal/contact M7 310. The plurality of metal/contact layers are shown in four configurations, illustrated in FIG. 3 as four columns (350, 355, 360, 365). It is noted that other metal layers may be present in the metal pattern solution without departing from the spirit and scope of the present invention. The checkered metals of FIG. 3 represent a coupling of a metal to a supply voltage VDD, while the clear metals of FIG. 3 represent a coupling of a metal to a ground. The checkered metals and the clear metals of FIG. 3 further contain contacts, illustrated as small black squares, that are operable to couple the checkered metals and the clear metals to other metal layers in the metal pattern solution. In metal pattern solution example 300, metal/contact M4 340 has output value 220, used as the mux select in FIG. 2, that is 0 during an initial configuration of the metal pattern solution. The initial configuration is illustrated in the first column 350 of FIG. 3. The metal pattern solution is housed within switching tower 210.

In a second configuration of the metal pattern solution the metal of M6 320 is changed. It is noted that in certain embodiments of the present invention this change, which occurs during a fabrication of the metal pattern solution, may occur at a later time after the initial configuration of first column 350. It is further noted that a design process may also be structured so that the configurations represented as the four columns (350, 355, 360, 365) occur concurrently using four fabrications of the metal pattern solution. Changing the metal of M6 320 causes metal layers (M5 330, M4 340) below metal M6 320 to invert their respective voltage orientation, thereby causing output value 220 of M4 340 to change from 0 to 1. The metal configuration after the change of M6 320 is illustrated as the second column 355 of FIG. 3.

During a third stage, the metal of M5 330 is changed, causing metal layer M4 340 below metal M5 330 to invert its voltage orientation. The inversion of the voltage orientation causes the output value 220 of M4 340 to be 0. The metal configuration after the changing M5 330 is illustrated as the third column 360 of FIG. 3. Finally, during a fourth stage, a contact change between M5 330 and M4 340 causes the output value 220 of M4 340 to be 1. The metal configuration after changing the contact of M4 340 is illustrated as the fourth column 365 of FIG. 3. In a certain embodiment of the present invention, each change of a metal or a contact of the metal pattern is followed by a fabrication of the metal pattern solution within an IC. The metal pattern solution example 300 shows that changing any metal of metal pattern solution or changing any contact of metal pattern solution can change an output value of a register containing a metal pattern solution.

It is noted that one of skill in the art will recognize that while this exemplary metal pattern is shown with four layers, a greater or fewer number of layers could be used without departing from the spirit and scope of the present invention. It is further noted that the orientation of the metals and contacts within the metal pattern solution may be configured as desired without departing from the spirit and scope of the invention, and does not impact the ability of the configurable register to allow a user to change a register value by changing one or more metals or one or more contacts of the metal pattern solution.

Figure 4:
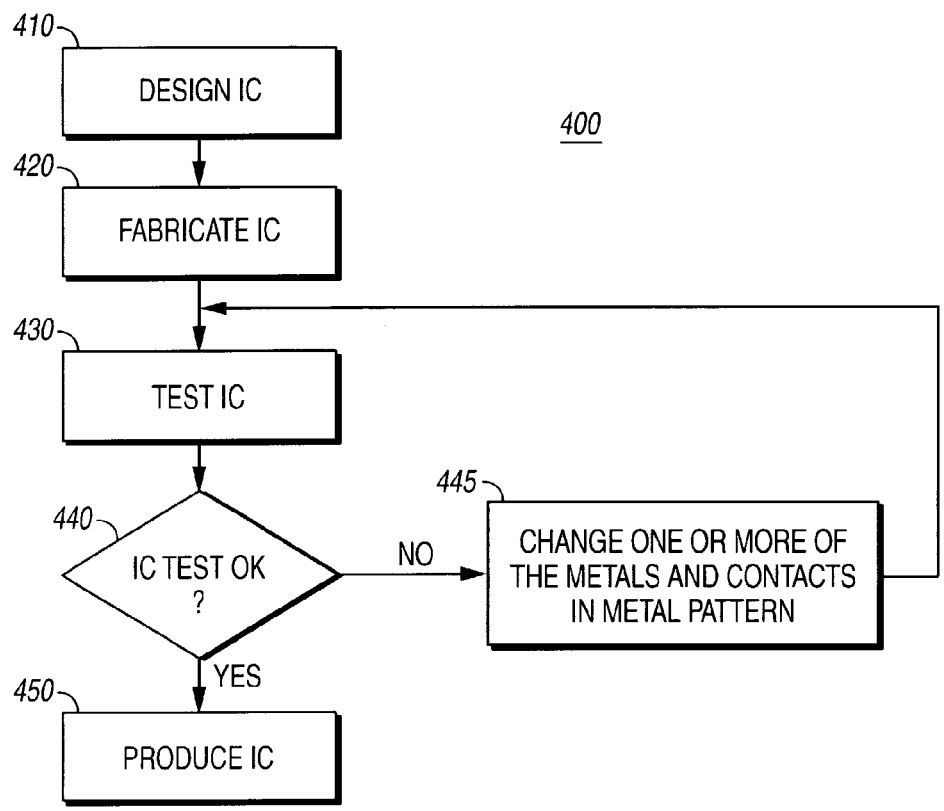
FIG. 4 is a block diagram of a process for changing one or more register values by changing a metal pattern, according to a certain embodiment of the present invention.

Referring now to FIG. 4, a flow diagram of a process for changing one or more register values and one or more contacts 400 is shown, according to a certain embodiment of the present invention. After an IC containing one or more registers and one or more contacts is designed (block 410), the IC is fabricated for testing (block 420). The IC is then tested for layout errors (block 430). In the certain embodiment of the present invention, the IC test measures the signal integrity of a signal of one or more signals in the IC. If the IC test fails (block 440), then one or more register values and one or more contacts may be changed during IC layout and the IC is tested again (blocks 420 and 430). The one or more register values and the one or more contact values may be adjusted through the use of a metal pattern solution as in block 445. It is noted that the metal pattern solution of FIG. 3 and the configurable register shown in FIG. 2 containing the same are operable to change the one or more register values and the one or more contact values without departing from the spirit and scope of the present invention. Referring again to FIG. 4, if the IC test of signal integrity is satisfactory, then the IC may be ready for production or testing of other modules (block 450). The metal pattern solution allows any metal or contact in any layer of the metal pattern solution to be changed to change an output register value of the one or more registers. In a certain embodiment of the present invention, the one or more register values and one or more contacts are chosen so that the signal integrity is maximized. It is noted that in alternative embodiments, other metrics could be used such as throughput, minimum number of test cycles, etc. In the diagram of FIG. 4, the use of a metal pattern solution that allows any metal change or contact change to change a register value of the one or more registers reduces fabrication costs. The fabrication cost increases as more metal layers are changed. Since the one or more registers do not require any particular metal layer, if a circuit comprising the one or more registers needs a particular layer, then the one or more registers would preferably just use that metal layer, so that the number of metal layers that need to be changed does not increase. If only the one or more registers need to be changed, then a cheaper layer could be chosen. In certain embodiments of the present invention, lower layers are more expensive than upper layers.

Figure 5:
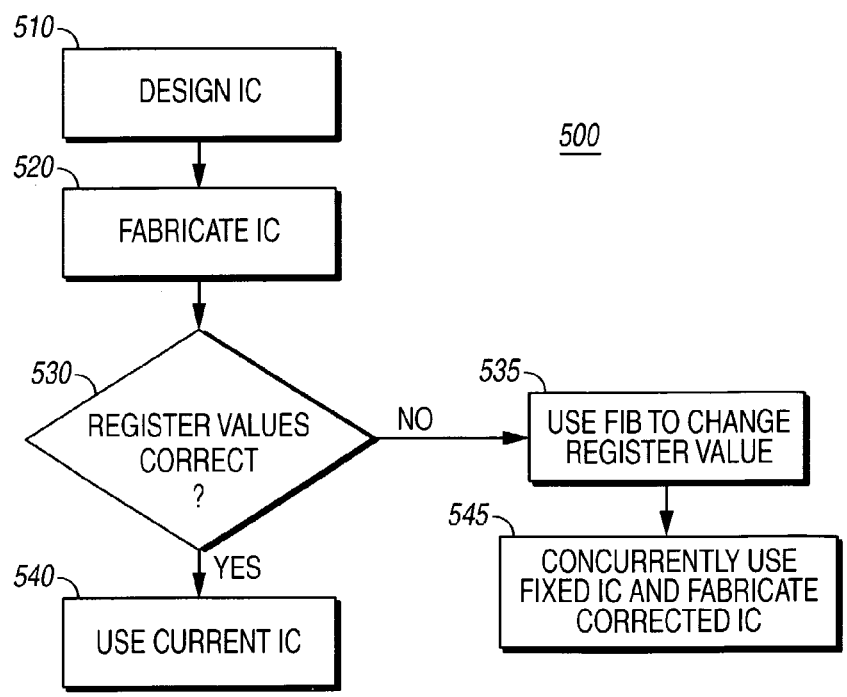
FIG. 5 is a flow diagram for a process of changing a register value using a focused ion beam (FIB), according to a certain embodiment of the present invention.

If a chip has been fabricated and does not work correctly because of incorrect register settings, a technique that allows the IC to operate while the register setting is being adjusted and re-fabricated would reduce the amount of time required for testing. Referring now to FIG. 5, a flow diagram for a process of changing a register value using a focused ion beam (FIB) 500 is shown, according to a certain embodiment of the present invention. After an IC has been designed and fabricated (block 510 and block 520), testing or operational use may determine that the IC register values are set incorrectly (block 530). If the register values are set incorrectly, then a focused ion beam (FIB) may be used to cut a connection that then toggles the value of the register (block 540). This allows this IC to be used, while the error in the register design is corrected (block 545). Note that this technique could be used to speed the time required to test an IC, or could be used in cases where an IC is in production and either design error or compatibility issues require a different register setting. In a certain embodiment of the present invention, a FIB is used to sever the connection between mux selection 220 and ground 215.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A structure operable to configure an output value of a register of one or more registers of an integrated circuit structure, said structure comprising a pattern coupled to the register that comprises a plurality of metal layers and a plurality of contacts coupled to said plurality of metal layers and operable to couple together one or more of the plurality of metal layers,
   wherein modifying said pattern by changing a configuration of one or more of the plurality of metal layers and the plurality of contacts modifies the output value of the register, and
   wherein the register is coupled to a ground potential, and a focused ion beam (FIB) is operable to sever the coupling to the ground potential so that the output value of the register is changed.

2. The structure in accordance with claim 1, wherein a change in a metal layer of the plurality of metal layers produces a corresponding change in the output value.

3. The structure in accordance with claim 1, wherein a change in a contact of the plurality of contacts produces a corresponding change in the output value.

4. The structure in accordance with claim 1, wherein successive changes to one or more metal layers of the plurality of metal layers produce corresponding alternating values in the output value.

5. The structure in accordance with claim 1, wherein successive changes to one or more contacts of the plurality of contacts produce corresponding alternating values in the output value of the register.

6. The structure in accordance with claim 1, wherein the output value is coupled to a control signal and wherein said control signal is operable to conserve power of the integrated circuit structure by limiting the amount of time the output value is valid.

7. The structure in accordance with claim 6, wherein the output value is coupled to a rising edge of the control signal.

8. The structure in accordance with claim 1, wherein the register is coupled to ground via a selection input coupled to a multiplexer at a first terminal and coupled to a metal switching tower at a second terminal, said metal switching tower comprising the plurality of contacts and the plurality of metal layers.

9. The structure in accordance with claim 8, wherein the selection input is operable to choose the output value from one of a plurality of inputs to the multiplexer.

10. An integrated circuit structure, comprising:
    a register of a plurality of registers of the integrated circuit structure; and
    a pattern coupled to the register, said pattern comprising a plurality of metal layers and a plurality of contacts coupled to said plurality of metal layers and operable to couple together one or more of the plurality of metal layers,
    wherein an output value of the register is changed by modifying a configuration of one or more of the plurality of metal layers and the plurality of contacts of said pattern, and
    wherein the register is by default coupled to a ground potential, and a focused ion beam (FIB) is operable to sever the coupling to the ground potential so that the output value of the register is changed.

11. The structure in accordance with claim 10, wherein successive changes to one or more metal layers of the plurality of metal layers produce corresponding alternating values in the output value.

12. The structure in accordance with claim 10, wherein successive changes to one or more contacts of the plurality of contacts produce corresponding alternating values in the output value of the register in the output value.

13. The structure in accordance with claim 10, wherein the output value is coupled to a control signal, and wherein said control signal is operable to conserve power of the integrated circuit structure by limiting the amount of time the output value is valid.

14. The structure in accordance with claim 13, wherein the output value is coupled to a rising edge of the control signal.

15. The structure in accordance with claim 10, wherein the register is coupled to ground via a selection input coupled to a multiplexer at a first terminal and coupled to a metal switching tower at a second terminal, said metal switching tower comprising the plurality of contacts and the plurality of metal layers.

16. The structure in accordance with claim 15, wherein the selection input is operable to choose the output value from one of a plurality of inputs to the multiplexer.

17. An integrated circuit structure, comprising:
    a register of a plurality of registers of the integrated circuit structure, wherein the register comprises a metal pattern; and
    a means for controlling an output value of the register by modifying a configuration of the metal pattern, wherein the means for controlling an output value of the register comprises:
    the metal pattern comprising a plurality of metal layers and a plurality of contacts coupled to said plurality of metal layers and operable to couple together one or more of the plurality of metal layers,
wherein the output value of the register is changed by modifying one or more of the plurality of metal layers and the plurality of contacts of said metal pattern and wherein the register is by default coupled to a ground potential and a focused ion beam (FIB) is operable to sever the coupling to the ground potential so that the output value of the register is changed.

* * * * *